United States Patent [19]
Yano et al.

[11] Patent Number: 5,463,248
[45] Date of Patent: Oct. 31, 1995

[54] SEMICONDUCTOR PACKAGE USING AN ALUMINUM NITRIDE SUBSTRATE

[75] Inventors: Keiichi Yano, Kawasaki; Takashi Takahashi; Kazuo Kimura, both of Tokyo; Yoshitoshi Sato, Yokohama; Kouji Yamakawa, Kawasaki; Toshishige Yamamoto; Masafumi Fujii, both of Nishinomiya; Shizuki Hashimoto, Yamaguchi; Hiroshi Takamichi, Ube, all of Japan

[73] Assignees: Kabushiki Kaisha Toshiba, Kanagawa; Sumitomo Metal Industries, Ltd., Osaka; Sumitomo Metal Ceramics Inc., Yamaguchi, all of Japan

[21] Appl. No.: 243,864

[22] Filed: May 17, 1994

[30] Foreign Application Priority Data

May 18, 1993 [JP] Japan ..................... 5-116249

[51] Int. Cl.$^6$ .............. H01L 23/02; H01L 23/48
[52] U.S. Cl. .............. 257/677; 257/736; 257/728; 257/705
[58] Field of Search .............. 257/678, 666, 257/698, 684, 700, 736, 690, 730, 692, 693; 257/677, 728, 705

[56] References Cited

U.S. PATENT DOCUMENTS

| | | | |
|---|---|---|---|
| 4,229,758 | 10/1980 | Ikari | 257/678 |
| 4,805,009 | 2/1989 | Pryor et al. | 257/677 |
| 4,942,454 | 7/1990 | Mori et al. | 257/677 |
| 5,015,803 | 5/1991 | Mahulikar et al. | 257/668 |
| 5,087,963 | 2/1992 | Kaneda et al. | 257/794 |
| 5,138,431 | 8/1992 | Huang et al. | 257/678 |
| 5,168,126 | 12/1992 | Matsumoto et al. | 257/678 |
| 5,227,583 | 7/1993 | Jones | 257/678 |
| 5,256,901 | 10/1993 | Ohashi et al. | 257/710 |
| 5,302,852 | 4/1994 | Kaneda et al. | 257/710 |
| 5,329,158 | 7/1994 | Lin | 257/666 |

FOREIGN PATENT DOCUMENTS

| | | | |
|---|---|---|---|
| 0002355 | 1/1984 | Japan | 257/666 |
| 62-22467 | 1/1987 | Japan. | |
| 0205650 | 9/1987 | Japan | 257/678 |
| 3-167850 | 7/1991 | Japan. | |
| 0023459 | 1/1992 | Japan | 257/690 |
| 0068559 | 3/1992 | Japan | 257/666 |
| 4-133456 | 5/1992 | Japan. | |

*Primary Examiner*—Robert P. Limanek
*Assistant Examiner*—Alexander Oscar Williams
*Attorney, Agent, or Firm*—Finnegan, Henderson, Farabow, Garrett & Dunner

[57] ABSTRACT

A semiconductor package comprises an aluminum nitride substrate having a semiconductor element mounted thereon, a lead frame junctioned to the side of the aluminum nitride substrate directly contacting the mounted semiconductor element, and a ceramic sealing member junctioned to the aluminum nitride substrate so as to seal the semiconductor element. The lead frame has a coating layer of a nonmagnetic metallic material formed in a thickness of not more than 20 μm on only one of the opposite surfaces of a lead frame matrix made of a ferromagnetic metal to which a bonding wire is to be junctioned. The layer of the nonmagnetic metallic material is formed by any of such thin film forming technique as the vacuum deposition technique, the spattering technique, and the plating technique. The coating layer formed on only one of the opposite surfaces of the lead frame matrix is capable of amply curbing the resistance and the dependency of inductance on frequency. The aluminum nitride substrate is capable of imparting an ideal ability to radiate heat. The semiconductor package enables a high-speed quality semiconductor element having such a high system clock frequency as is not less than 50 MHz to be operated stably.

15 Claims, 6 Drawing Sheets

SEMICONDUCTOR PACKAGE USING AN ALUMINUM NITRIDE SUBSTRATE

BACKGROUND OF THE INVENTION

1. Field of the Invention

This invention relates to a semiconductor package using an aluminum nitride substrate.

2. Description of the Related Art

Generally, plastic packages, metallic packages, and ceramic packages are used for packaging semiconductor elements. Among other packages mentioned above, ceramic packages particularly manifest high reliability in effecting airtight sealing of LSI's and enjoy prominence in moisture-proofness and ability to radiate heat. The ceramic packages, therefore, are utilized in packaging a CMOS gate array, an ECL gate array, etc. which are used in arithmetic units of computers.

These ceramic packages structurally are known in such forms as DIP (dual in-line packages) and QFP (quad flat packages) using a lead frame, PGA (pin grid packages) using a lead pin, and LGA (land grid packages) using a land for input/output operations, for example. Among other ceramic packages mentioned above, the ceramic packages which use a lead frame are simple in construction and inexpensive to manufacture and, therefore, are widely used in various kinds of semiconductor elements. Particularly, QFP's find extensive utility because they can tolerate addition to the number of input/output signals and because they are of the type forming a surface package.

For the lead frames of the ceramic packages, such Fe—Ni type alloys as 42 wt%Ni—Fe and 29 wt%Ni-16 wt%Co—Fe are generally used. Since these Fe—Ni type alloys are ferromagnetic materials, however, they are at a disadvantage in entailing growth of resistance due to the skin effect either immediately after the rise time of a pulse signal or during the occurrence of a high frequency signal or suffering the magnitude of inductance to be affected by frequency. FIG. 7 illustrates the dependency on frequency of the resistance of a QFP using a lead frame made of 42 wt%Ni—Fe. FIG. 8 illustrates the dependency on frequency of the inductance of the same QFP as mentioned above.

Since the dependency of the resistance and that of the inductance on frequency invariably have adverse effects on the operating characteristics of semiconductor elements, a great need has been felt for improvements capable of eliminating these adverse effects. Particularly, recent semiconductor elements have been showing a clear trend toward increasing operating frequency (system clock frequency) for the sake of exalting their operating speed. Since the skin effect gains in prominence proportionately to the rise of frequency, the need to take a measure capable of overcoming this skin effect is being felt strongly. The skin effect offers a problem particularly to those semiconductor elements which have system clock frequencies of not less than 50 MHz. The semiconductor elements which have adopted increased clock frequencies tend to generate increased amounts of heat. To ensure stable operation of these semiconductor elements, it is likewise important that they should be adapted to tolerate the growth in the amount of heat to be generated.

Thus, for the semiconductor packages serving to accommodate semiconductor elements the clock frequencies of which are high, it is important to improve the electric characteristics thereof to the extent of precluding growth of resistance due to the skin effect and, at the same time, adopt a measure to cope effectively with the growth in the amount of heat to be generated.

Incidentally, Japanese Laid-Opened Patent Application No. HEI 3-167,850 discloses a semiconductor package using a lead frame which is composed of a core made of an Fe—Ni type alloy and a Cu layer clad on the surface of the core. The lead frame of the Fe—Ni type alloy has the surface thereof coated with the Cu clad layer because the Fe—Ni type alloy has a low electrical conductivity and because the increase of resistance due to the extreme reduction of the lead frame (extreme reduction of the terminal) in size must be made up for. The thickness of the Cu clad layer is specified to be in the range of 20 to 40% of the cross section of the core of the Fe—Ni type alloy. When the Cu clad layer is applied to the lead frame, the thickness itself of this layer increases. For the purpose of forming the lead frame in a stated thickness, therefore, it is only natural that the core of the Fe-Ni type alloy itself should be proportionately decreased in thickness. The lead frames are tending to decrease thickness for the sake of coping with the general upward trend of the number of input/output signals to be handled in semiconductor elements. If the core of the Fe—Ni type alloy itself decreases thickness, therefore, the lead frame will entail a decrease in the overall strength thereof and will suffer from a decline in packageability, for example.

Then, Japanese Laid-Opened Patent Application No. HEI 4-133,456 discloses a semiconductor device (semiconductor package) which comprises a lead frame (inner lead) made of an Fe—Ni alloy and thin-film layers of such a nonmagnetic material as Al or an Al alloy deposited one each on the opposite surfaces of the lead frame as by the vacuum deposition technique. When the thin-film layers of Al or an Al alloy are superposed on the opposite surfaces of the lead frame made of the Fe—Ni alloy as by the vacuum deposition technique, however, the following problems will ensue. This provision of the thin-film layers of Al on the opposite surfaces of the lead frame requires first to have a lead frame set in a vacuum tank of a vacuum deposition device, vacuumize the vacuum tank, then cause vacuum deposition of Al on one of the opposite surfaces of the lead frame, open the vacuum tank and set the lead frame in the reversed state, again vacuumize the vacuum tank, and subsequently effect vacuum deposition of Al on the remaining surface of the lead frame. This complicated procedure is indispensable for the formation of the thin-film layers of Al on the opposite surfaces of the lead frame. This fact results in a notable increase in the cost of production of the lead frame. The ceramic packages of the form using a lead frame particularly enjoys inexpensiveness among other features. This prominent feature is lost, however, when the thin-film layers as of Al are formed on the opposite surfaces of the lead frame.

SUMMARY OF THE INVENTION

It is, therefore, an object of this invention to provide a semiconductor package which is made of an inexpensive package of the form using a lead frame and adapted to prevent the resistance of lead frame from unduly increasing and curb the dependency of inductance on frequency and, at the same time, improve the heat-radiating property of lead frame to a point where a semiconductor element particularly of the type having a system clock frequency of not less than 50 MHz is enabled to operate stably. It is also an object of this invention to provide a semiconductor package which is adapted to ensure stable operation of a semiconductor element and, at the same time, prevent the lead frame from losing strength and the cost of production of the lead from increasing.

The semiconductor package of the present invention is characterized by comprising an aluminum nitride substrate having a semiconductor element mounted thereon, a lead frame junctioned to the side of the aluminum nitride substrate mounting said semiconductor element and composed of a lead frame matrix of a ferromagnetic metal and a coating layer of a nonmagnetic metallic material superposed on only one of the opposite surfaces of the lead frame matrix in a thickness of not more than 20 μm, a bonding wire junctioned on the coating layer of the nonmagnetic metallic material and electrically connecting the semiconductor element and the lead frame, and a ceramic sealing member junctioned to the aluminum nitride substrate in such a manner as to cover the semiconductor element.

In the semiconductor package of this invention, the thin coating layer made of a nonmagnetic metallic material is provided on only one of the opposite surfaces of the lead frame matrix of a ferromagnetic material (such as, for example, an Fe—Ni type alloy) to which the bonding wire is junctioned. To be specific, the coating layer of a nonmagnetic metallic material is formed in a thickness of not more than 20 μm and provided on only one of the opposite surfaces of the lead frame matrix. The coating layer of the nonmagnetic metallic material is produced by any of such well-known thin-film forming means as the vacuum deposition technique, the spattering technique, and the plating technique.

As regards the distribution of electric current in a cross section of the conductor, the current distribution concentrates on the surface of the cross section and the current ceases to flow in the interior of the conductor either immediately after the rise time of a pulse or during the occurrence of a high frequency signal. This phenomenon is called a skin effect. The skin effect grows and the depth of the skin affected by the skin effect (the thickness of the skin from the surface in which the current distribution is concentrated) dwindles and the resistance mounts in proportion as the frequency is heightened. Further, the ferromagnetic material such as, for example, Ni manifests such a large specific permeability as 294. Besides, the specific permeability manifests dependency on frequency. The specific permeability which is large at a low frequency begins to decrease when the frequency surpasses a certain level and it approximates to 1 when the frequency passes the level of some hundreds of MHz. The inductance of the ferromagnetic material thus depends on frequency. In contrast, the weak magnetic material (such as, for example, Al, Cr, Pt, or Cu) manifests a permeability virtually equal to the permeability in a vacuum ($\mu_0 = 4\pi \times 10^{-7}$ H/m) and, accordingly can be regarded as possessing a specific permeability of 1. The inductance of the weak magnetic material, therefore, manifests virtually no dependency on frequency.

As regards the skin effect, the thickness of the skin in which the current distribution concentrates decreases in proportion as the frequency increases and the concentration of the current occurs in the surface to which the bonding wire is junctioned. By having the very thin low-resistance coating layer (the coating layer made of a nonmagnetic metallic material) provided on only one of the opposite surfaces of the lead frame matrix as in the semiconductor package of the present invention, therefore, the resistance offered by the lead frame can be amply lowered to the same extent as when the layers of a nonmagnetic metallic material are provided one each on the opposite surfaces. Further, the dependency of the inductance on frequency can be eliminated by the provision of the coating layer made of the nonmagnetic metallic material. Thus, the inductance can be fixed at a substantially constant level without relying on frequency.

The semiconductor package of the present invention is free from the growth of resistance in the lead frame due to the skin effect and from the dependency of the inductance on frequency as described above. Thus, it enables a semiconductor element whose operating speed is exalted to the extent of requiring a system clock frequency of not less than 50 MHz to be operated stably. Semiconductor elements adapted to operate at high speeds tend to add notably to the amount of heat to be generated. If the heat generated by a semiconductor element is not fully radiated, the possibility of the semiconductor element performing an erroneous operation may ensue. The semiconductor package of this invention exhibits an outstanding heat radiating property because it uses a package substrate made of aluminum nitride. As a result, the semiconductor package of the present invention fulfills both the improvement of electric characteristics to the extent of curbing the otherwise inevitable growth of resistance due to the skin effect and the impartation of an ability to tolerate the growth in the amount of the heat to be generated. This invention, therefore, offers an optimum package for the accommodation of a semiconductor element of the kind operating with a high clock frequency.

In the semiconductor package of this invention, the coating layer of a nonmagnetic metallic material is formed on only one of the opposite surfaces of the lead frame matrix. Thus, the labor required for the formation of the layer of the nonmagnetic metallic material can be decreased roughly to one half of the labor which is required where the layer is formed on each of the opposite surfaces. This saving of labor results in a notable cut in the cost of production of the semiconductor package. Further, since the thickness of the layer of the nonmagnetic metallic material has the upper limit thereof set at 20 μm, the lead frame matrix which is made of a ferromagnetic material is allowed to have an ample wall thickness. As a result, the lead frame is infallibly endowed with fully satisfactory strength and prevented from sacrificing such characteristics as packageability.

DESCRIPTION OF THE PREFERRED EMBODIMENTS

Now, this invention will be described more specifically below with reference to working examples thereof.

Figure 1:
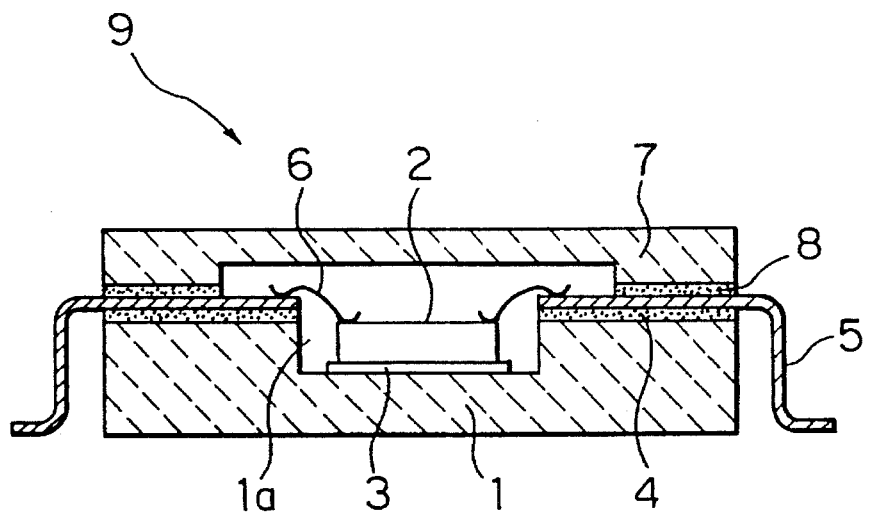
FIG. 1 is a cross section illustrating the construction of a semiconductor package as one embodiment of this invention.

FIG. 1 is a cross section illustrating the construction of a semiconductor package (QFP) as one embodiment of the present invention. In this diagram, 1 stands for an aluminum nitride substrate provided with a cavity 1a destined to serve as a part for accommodating a semiconductor element 2. This aluminum nitride substrate 1 comprises an aluminum nitride sinter containing a suitable amount of yttrium oxide and/or aluminum oxide as a sintering assistant. The aluminum nitride substrate 1 exhibits outstanding thermal conductivity and ideally radiates the heat generated by the semiconductor element 2. The sintered mass of aluminum nitride which is used as the aluminum nitride substrate 1 is desired to possess thermal conductivity of not less than 100 W/m·K.

A chip mounting part 3 is provided in the cavity 1a of the aluminum nitride substrate 1. On the surface of the aluminum nitride substrate 1 serving the purpose of directly supporting the semiconductor element 2, namely on the end face in the outer edge part of the aluminum nitride substrate 1, a lead frame 5 is junctioned as with the aid of a fixing glass 4. The lead frame 5 is electrically connected through the medium of a bonding wire 6 to the electrodes of the semiconductor element 2.

Figure 2:
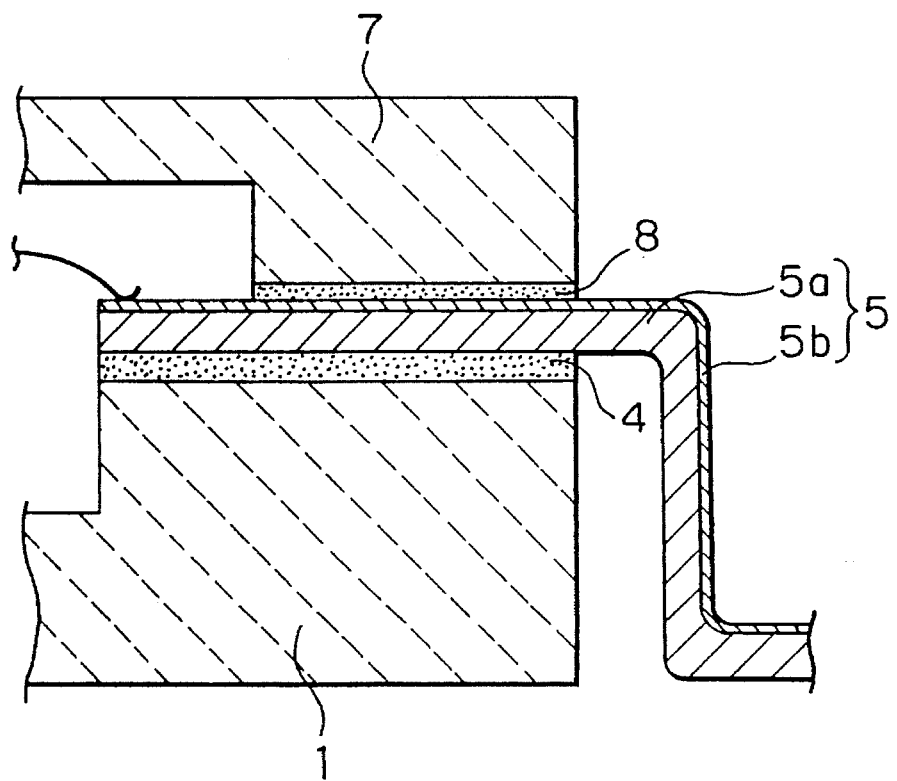
FIG. 2 is a cross section illustrating the essential part of the semiconductor package of FIG. 1 on a magnified scale.

The lead frame 5, as shown in FIG. 2 which is a cross section illustrating the essential part thereof on a magnified scale, is composed of a lead frame matrix 5a made of a ferromagnetic metal and a coating layer 5b made of a nonmagnetic metallic material and formed on only one of the opposite surfaces of the lead frame matrix 5a in a thickness of not more than 20 μm. The coating layer 5b is formed only on the surface to which the bonding wire 6 is junctioned.

As concrete examples of the ferromagnetic metal of which the lead frame matrix 5a is formed, such Fe—Ni type alloys as 42 wt%Ni—Fe (the so-called 42-alloy) and 29 wt%Ni-16 wt%Co—Fe (Kovar type alloy) may be cited.

Figure 3:
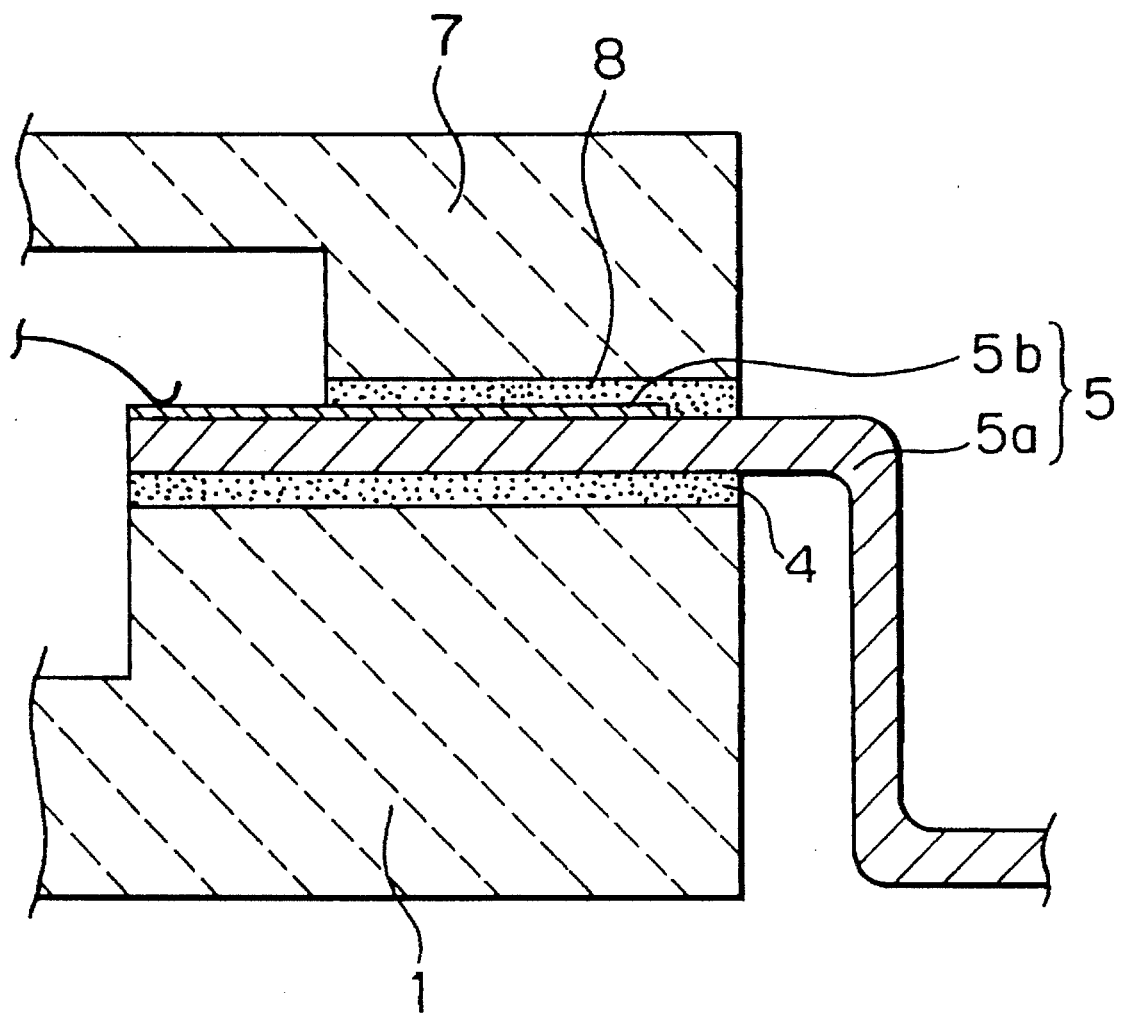
FIG. 3 is a cross section illustrating the essential part of a semiconductor package as another embodiment of this invention on a magnified scale.

The layer 5b of a nonmagnetic metallic material, as shown in FIG. 2, may be formed as extended throughout the whole surface from an inner lead (the part existing inside the semiconductor package) through an outer lead (the part existing outside the semiconductor package). It may be otherwise formed so as to protrude partly on the outer lead. This construction permits addition to the surface area of the layer 5b of the nonmagnetic metallic material notwithstanding the layer 5b is provided only on one of the opposite surface of the lead frame matrix 5a and consequently enables the layer 5b to manifest the effect thereof to a further extent. It should be noted, however, that the layer 5b of the nonmagnetic metallic material is not always required to cover the entire area of the one selected surface of the lead frame matrix 5a. If this layer 5b of the nonmagnetic metallic material is provided only on the inner lead of the lead frame 5 as illustrated in FIG. 3, for example, it can fully manifest the effect thereof.

Various materials including paramagnetic materials such as of Al, Cr, Mo, and Pt and diamagnetic materials such as of Cu, Ag, and Au which are either magnetized only quite feebly or not magnetized at all can be used for the formation of the layer 5b of the nonmagnetic metallic material. As concrete examples of the material usable for the formation under discussion, the metallic elements specifically mentioned above and the alloys using these metallic elements as a main component thereof can be cited. The nonmagnetic metallic material to be used in this invention is desired to possess a small specific resistance. The reason for the small specific resistance is that the layer 5b of the nonmagnetic metallic material ought to function mainly as an electrically conductive layer.

The thickness of the layer 5b of the nonmagnetic metallic layer is not more than 20 μm as mentioned above. The part (skin) in which the current distribution is concentrated by the skin effect, as mentioned above, becomes thin in proportion as the frequency increases. The electric current concentrates in the surface to which the bonding wire is junctioned. The layer 5b of the nonmagnetic metallic material which functions as an electrically conductive layer, therefore, lends itself to fully lowering the resistance of the lead frame 5 notwithstanding the thickness thereof is not more than 20 μm and the layer 5b is provided only on one of the opposite surfaces of the lead frame matrix 5.

In the semiconductor package of this invention, since the layer 5b of the nonmagnetic metallic material is provided only on one surface, this layer 5b is desired to have a thickness of not less than 8 μm for the sake of ensuring full manifestation of its function as an electrically conductive layer. Preferably the thickness of the layer 5b of the nonmagnetic metallic material is in the range of 8 to 20 μm.

If the thickness of the layer 5b of the nonmagnetic metallic material exceeds 20 μm, the wall thickness of the lead frame matrix 5a which affords the lead frame 5 mechanical strength decreases in proportion as the excess thickness increases, with the result that the lead frame matrix 5a suffers from deficiency in strength. The decrease of strength of the lead frame matrix 5a poses a problem particularly when the number of input/output signals is increased. Specifically when the thickness of the lead frame is decreased in order to facilitate the formation of a very thin lead, the decrease in the strength of the lead frame matrix 5a grows conspicuous to the extent of jeopardizing such properties as packageability. While the wall thickness of the lead frame matrix 5 is not particularly limited, this invention manifests its effect prominently particularly when this wall thickness is limited to within 150 μm. Practically, it is in the approximate range of 100 to 200 μm.

The coating layer 5b of a nonmagnetic metallic material is formed on the surface of the lead frame matrix 5a by any of such thin-film forming means as the vacuum deposition technique, the spattering technique, and the plating technique. By adopting such a thin-film forming means as mentioned above, the layer 5b of the nonmagnetic metallic material can be uniformly formed in a thickness of not more than 20 μm on the surface of the lead frame matrix 5a. As a result, the layer 5b of the nonmagnetic metallic material consequently produced is enabled to manifest stably the function thereof as an electrically conductive layer.

To the upper surface side of the aluminum nitride substrate 1 on which the semiconductor element 2 is junctioned and mounted, a ceramic sealing member (cap) 7 is junctioned through the medium of the lead frame 5 described above as with a sealing glass 8 such as, for example, low-melting glass. It is with this sealing member 7 that the semiconductor element 2 is airtightly sealed. Though any of various kinds of sintered ceramic mass is adoptable as the material for the ceramic sealing member 7, it is desirable to use a sintered mass of aluminum nitride in consideration of the heat radiating property. When the sealing member 7 is formed of such a ceramic substance as mullite, a substance which is inferior to aluminum nitride in ability to radiate heat, it can be rendered effectively usable by enhancing the radiation of heat on the substrate side thereby compensating the inferiority mentioned above. The semiconductor package is constructed as described above.

As concrete examples of the nonmagnetic metallic material of which the coating layer 5b of the lead frame 5 is made, the metallic elements mentioned above and the alloys using these metallic elements as a main component thereof may be cited. Among other materials cited above, Al and Pt prove particularly suitable. Cu, for example, possesses a large thermal expansion coefficient and, on adjoining the aluminum nitride substrate 1, gives rise to a large thermal stress in the consequently formed interface possibly to the extent of degrading the reliability with which the semiconductor package is sealed. Further, since Cu is susceptible to oxidation, it is liable to degrade the reliability with which the lead frame 5 is junctioned and sealed. In contrast, Al and Pt differ only slightly in thermal expansion from the ceramic sealing member 7 (made of a sintered mass of aluminum nitride, for example) and, therefore, lend themselves to exalting the reliability with which the semiconductor package is sealed.

Figure 4:
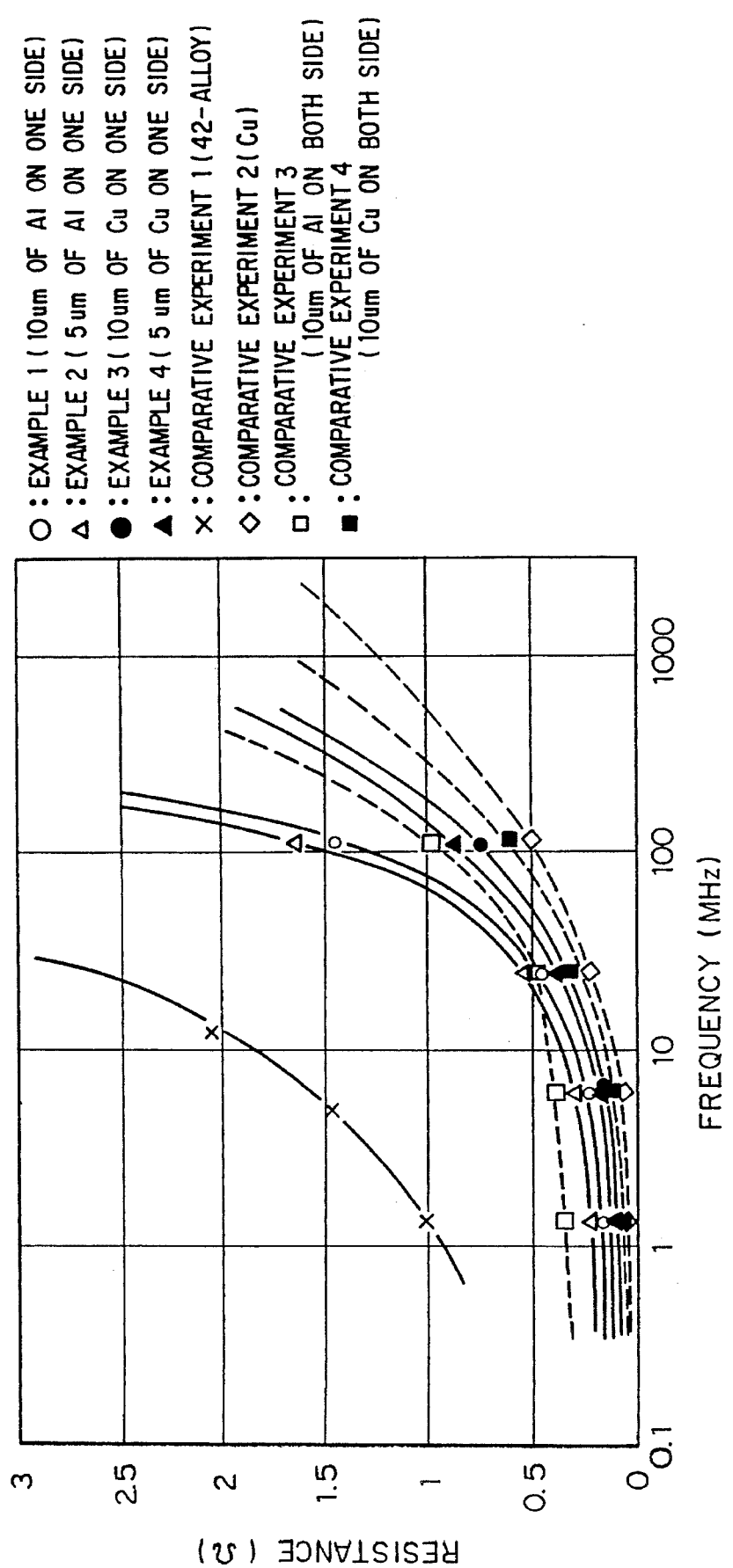
FIG. 4 is a diagram showing the relation between the resistance and the frequency which is obtained of the lead frame according to this invention as compared with the same relation obtained of a conventional lead frame.

FIG. 4 shows the results of a test performed on a sample having a coat of Al as a nonmagnetic metallic material formed in a thickness of 10 μm on only one of the opposite surfaces of a lead frame matrix made of a 42 wt%Ni—Fe (42-alloy) (Example 1), a sample having the same coat of Al formed in a thickness of 5 μm similarly on the same lead frame matrix (Example 2), a sample having a coat of Cu as a nonmagnetic metallic material formed in a thickness of 10 μm similarly on the same lead frame matrix (Example 3), and a sample having the same coat of Cu formed in a thickness of 5 μm on the same lead frame matrix (Example 4) to determine the change of resistance vs frequency. For the determination of resistance, a network analyzer (HP8753C) having a bandwidth ranging from 300 kHz to 6 GHz was used. For comparison with this invention, the diagram additionally shows the results of the same test performed on a sample using a lead frame made of a 42 wt%N—Fe (Comparative Experiment 1), a sample using a lead frame made of Cu (Comparative Experiment 2), a sample having an Al coat formed in a thickness of 5 μm (a total of 10 μm) on each of the opposite surfaces of a lead frame matrix made of a 42 wt%Ni—Fe (Comparative Experiment 3), and a sample having a Cu coat formed in a thickness of 5 (a total of 10 μm) on each of the opposite surfaces of the same lead frame matrix (Comparative Experiment 4).

It is clearly noted from FIG. 4 that while the lead frame made of the 42 wt%Ni—Fe (42-alloy) (Comparative Experiment 1) showed an increase of resistance proportionate to an increase of frequency, the lead frames having the layer 5b of a varying nonmagnetic metallic material formed on only one of the opposite surfaces thereof (Examples 1 to 4) invariably realized repression of resistance without reference to frequency similarly to the lead frame made of Cu (Comparative Experiment 2) and the lead frames coated on both the opposite surfaces thereof respectively with Al and Cu (Comparative Experiment 3 and 4).

In each of the aforementioned working examples of this invention, since the layer of a nonmagnetic metallic material was formed on only one of the opposite surfaces of a relevant lead frame, the cost of formation of this layer was about one half of the cost required in Comparative Experiments 3 and 4 which had an Al coat and a Cu coat respectively formed on each of the opposite surfaces of relevant lead frames. The cost of formation of the layer of a nonmagnetic metallic material accounts for about one half of the cost of production of a lead frame. By halving the cost of formation of the layer of a nonmagnetic metallic material as attained in the working examples, therefore, the cost of production of the lead frame according to this invention can be decreased to about three quarters of the cost required in the production of the lead frames of the comparative experiments having the Al coat and Cu coat respectively formed on each of the opposite surfaces thereof. The cost of production of the lead frame accounts for about one third of the cost of production of the semiconductor package incorporating the lead frame. The semiconductor package of this invention, accordingly, is estimated to allow a reduction in the cost of production thereof by about 5 to 10% as compared with the conventional semiconductor package incorporating therein a lead frame having an Al coat or a Cu coat formed on each of the opposite surfaces thereof.

The nonmagnetic metallic material, as already noted, can be regarded as possessing a specific permeability of 1. Thus, the inductance of a feebly magnetic material has no dependency on frequency. By having the coating layer 5b of a nonmagnetic metallic material formed in a thickness of not more than 20 μm on only one of the opposite surfaces of the lead frame 5, therefore, the inductance of the lead frame 5 can be kept practically constant in a high frequency zone such as, for example, a frequency zone of not less than 10 MHz.

Figure 5:
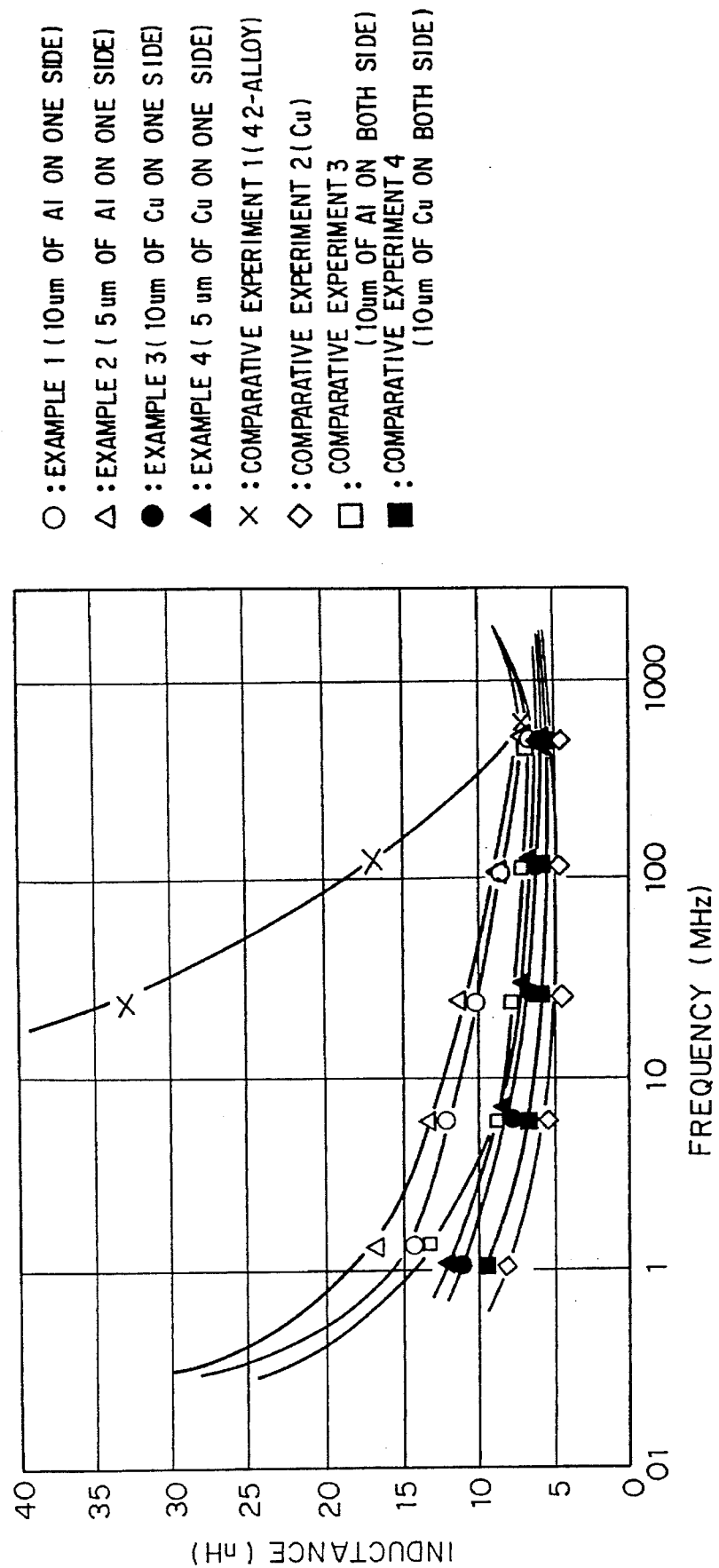
FIG. 5 is a diagram showing the relation between the inductance and the frequency which is obtained of the lead frame according to this invention as compared with the same relation obtained of the conventional lead frame.

FIG. 5 shows the results of a test performed on the samples of the same lead frames (Examples 1 to 4 and Comparative Experiments 1 to 4) as those whose test results are shown in FIG. 4 to determine the change in inductance vs frequency. It is clearly noted from the diagram that while the lead frame made of the 42 wt%Ni—Fe (42-alloy) (Comparative Experiment 1) showed a large change of inductance due to resistance, the lead frames having the layer 5b of a varying nonmagnetic metallic material formed on only one of the opposite surfaces thereof (Examples 1 to 4) invariably obtained a practically constant inductance without reference to frequency similarly to the lead frame made of Cu (Comparative Experiment 2) and the lead frames coated on both the opposite surfaces thereof respectively with Al and Cu (Comparative Experiment 3 and 4).

A semiconductor package 9 which embodies this invention is suitable for mounting the semiconductor element 2 whose number of input/output signals handled by the lead frame 5 is not less than 100 and whose system clock frequency is not less than 50 MHz and particularly in the range of 100 to 700 MHz. The reason for this suitability is as follows.

In the case of a high frequency such as is not less than 50 MHz, it is necessary that signals should be propagated without inducing either loss or strain in a low frequency region through a high frequency region. It is, therefore, desirable to repress the growth of resistance due to the skin effect and diminish the dependency of inductance on frequency. When the system clock frequency is heightened, the amount of heat generated by the semiconductor element 2 tends to increase.

In response to the demand for such characteristic properties as mentioned above, the semiconductor package 9 embodying this invention permits the resistance of the lead frame 5 to be notably lowered and, at the same time, eliminates the dependency of inductance on frequency when the skin effect grows prominent at a high frequency because the coating layer 5b of a nonmagnetic metallic material is formed on only one of the opposite surfaces of the lead frame matrix 5a as described above. Besides, the use of the aluminum nitride substrate 1 results in endowing the package with an enhanced capacity for radiation of heat. The semiconductor package 9, therefore, enables the semiconductor element to acquire as high transmission characteristics for high-frequency signals as when the lead frame is made of Cu or when the layer of a nonmagnetic metallic material is formed on each of the opposite surfaces of a lead frame and, at the same time, precludes the semiconductor element from committing an erroneous operation under the influence of heat. The semiconductor package 9 of this quality enables the semiconductor element 2 using such a high system clock frequency as is not less than 50 MHz to operate stably.

Figure 6:
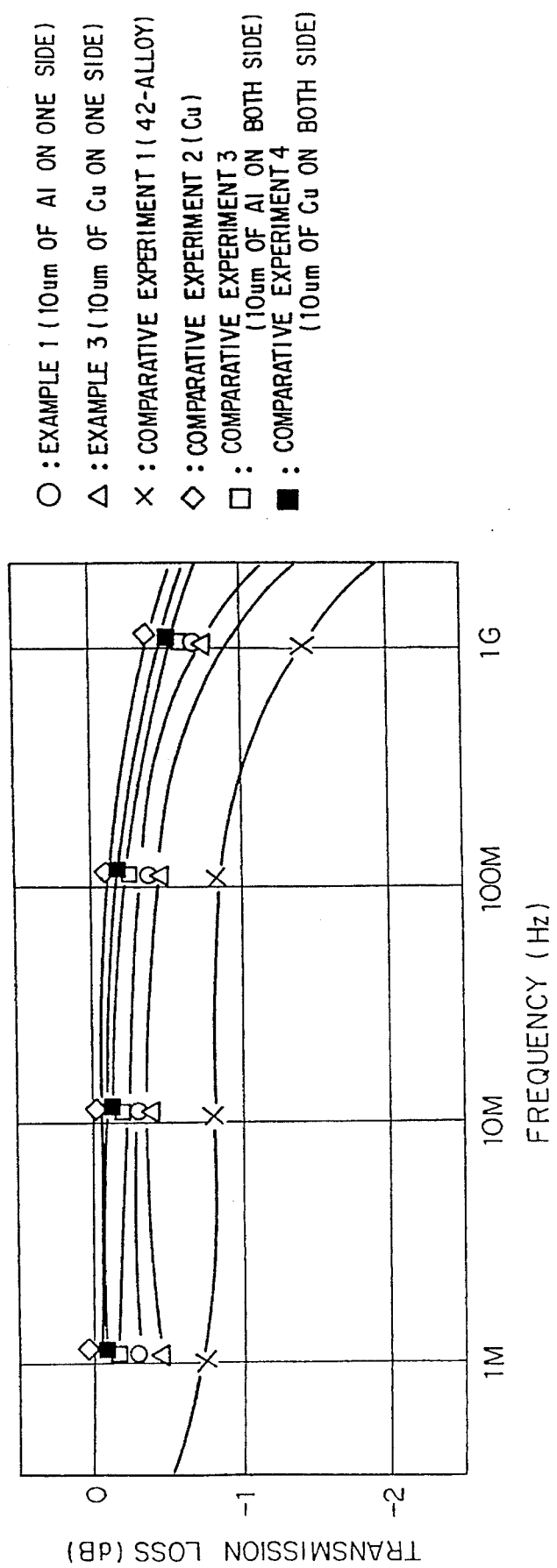
FIG. 6 is a diagram showing the relation between the transmission characteristic and the frequency which is obtained of the semiconductor package according to this invention as compared with the same relation obtained of the conventional semiconductor package.
Figure 7:
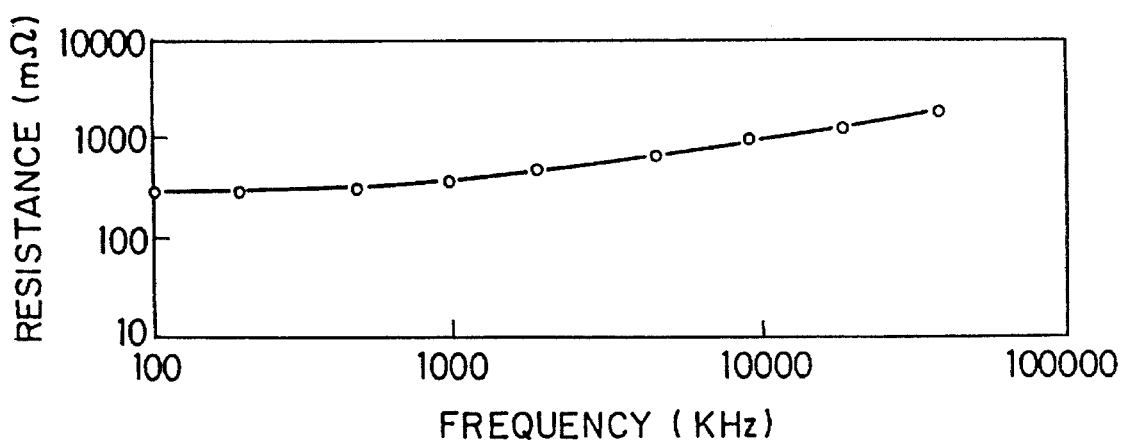
FIG. 7 is a diagram showing the dependency on frequency of the resistance of the conventional lead frame made of an Fe—Ni type alloy.
Figure 8:
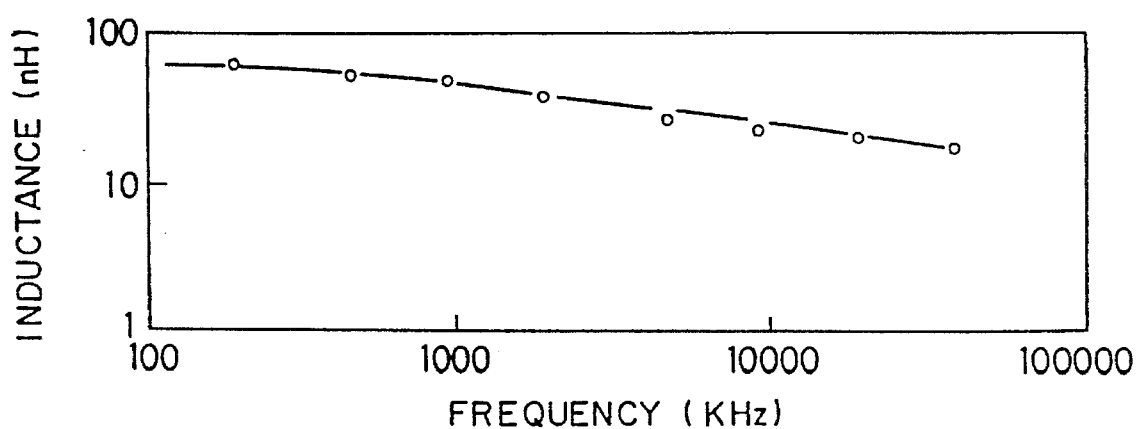
FIG. 8 is a diagram showing the dependency on frequency of the inductance of the conventional lead frame made of an Fe—Ni type alloy.

FIG. 6 shows the results of a test performed on a sample having a coat of Al as a nonmagnetic metallic material formed in a thickness of 10 μm on only one of the opposite surfaces of a lead frame matrix made of a 42 wt%Ni—Fe (42-alloy) (Example 1), a sample having a coat of Cu as a nonmagnetic metallic material formed in a thickness of 10 μm similarly on the same lead frame matrix (Example 3), a sample using a lead frame made of a 42 wt%N—Fe (Comparative Experiment 1), a sample using a lead frame made of Cu (Comparative Experiment 2), a sample having an Al coat formed in a combined thickness of 10 μm on both the opposite surfaces of a lead frame matrix made of a 42 wt%Ni—Fe (Comparative Experiment 3), and a sample having a Cu coat formed in a combined thickness of 10 μm on both the opposite surfaces of the same lead frame matrix (Comparative Experiment 4) to determine the transmission characteristics of relevant QFP's. For the determination of transmission characteristics, a network analyzer (HP8753C) having a bandwidth ranging from 300 kHz to 6 GHz was used.

The semiconductor package 9 embodying this invention permits the cost of production thereof to be notably lowered as compared with the conventional semiconductor package having the layer of a nonmagnetic metallic material formed on each of the opposite surfaces of the lead frame matrix. Further, the mechanical strength, etc. of the lead frame 5 are fully furnished by the lead frame matrix 5a. These characteristics are combined so as to stabilize the operating characteristics of the semiconductor element 2 and, at the same time, enable the semiconductor package to keep ideal packageability intact for a long time and to be produced at a generously reduced cost.

Besides, the package itself is constructed with a simple lead frame. Despite the use of this lead frame which is not expensive, the produced package enjoys improvements in electric properties, particularly high-frequency characteristics. Further, the use of the aluminum nitride substrate 1 which exhibits an excellent ability to radiate heat permits miniaturization of the package. And this miniaturization of package is effective in curbing signal delay.

It is clearly noted from the working examples cited above that the semiconductor package according to this invention is capable of lowering the resistance of the lead frame and curbing the dependency of inductance on frequency and, at the same time, ensuring infallible impartation of an ideal ability to radiate heat. It is also capable of preventing the lead frame from losing strength and keeping the cost of production from unduly increasing. Thus, the present invention provides a semiconductor package inexpensively in addition to enabling the semiconductor element to operate stably and the package itself to keep the packageability intact for a long time.

What is claimed is:

1. A semiconductor package comprising an aluminum nitride substrate having a semiconductor element mounted thereon, a lead frame junctioned to a side of said aluminum nitride substrate mounting said semiconductor element and composed of a lead frame matrix of a ferromagnetic metal and a coating layer of a nonmagnetic metallic material superposed on only one of opposite surfaces of said lead frame matrix, said coating layer having a thickness in the range of 8 to 20 μm, a bonding wire junctioned on said coating layer of nonmagnetic metallic material and electrically connecting said semiconductor element with said lead frame, and a ceramic sealing member junctioned to said aluminum nitride substrate in such a manner as to cover said semiconductor element.

2. A semiconductor package according to claim 1, wherein said coating layer of nonmagnetic metallic material is formed on a surface of an inner lead and a part of an outer lead of said lead frame so as to protrude at least partly from the inner lead toward the outer lead.

3. A semiconductor package according to claim 1, wherein said coating layer of nonmagnetic metallic material is formed only on a surface of an inner lead in said lead frame.

4. A semiconductor package according to claim 1, wherein said nonmagnetic metallic material includes at least one metallic element selected from a group consisting of Al, Pt, Cr, Mo, Cu, Ag, Au, and alloys thereof.

5. A semiconductor package according to claim 1, wherein said lead frame matrix is made of either a Ni—Fe alloy or a Ni—Co—Fe alloy.

6. A semiconductor package according to claim 1, wherein said package possesses a QFP construction.

7. A semiconductor package according to claim 1, wherein said semiconductor element has a system clock frequency of not less than 50 MHz.

8. A semiconductor package according to claim 1, wherein said coating layer of the nonmagnetic metallic material is formed by at least a thin film forming technique selected from a group consisting of a vacuum deposition technique, a spattering technique, and a plating technique.

9. A semiconductor package comprising an aluminum nitride substrate having a semiconductor element mounted thereon, a lead frame junctioned to a side of said aluminum nitride substrate mounting said semiconductor element and composed of a lead frame matrix of a ferromagnetic metal and a coating layer of a nonmagnetic metallic material superposed on only one of opposite surfaces of said lead frame matrix by a thin film forming technique, said coating layer having a thickness in the range of 8 to 20 μm, a bonding wire junctioned on said coating layer of the nonmagnetic metallic material and electrically connecting said semiconductor element with said lead frame, and a ceramic sealing member junctioned to said aluminum nitride substrate in such a manner as to cover said semiconductor element.

10. A semiconductor package according to claim 9, wherein said nonmagnetic metallic material includes at least one metallic element selected from a group consisting of Al, Pt, Cr, Mo, Cu, Ag, Au, and alloys thereof.

11. A semiconductor package according to claim 9, wherein said lead frame matrix is made of either a Ni—Fe alloy or a Ni—Co—Fe alloy.

12. A semiconductor package according to claim 9, wherein said package possesses a QFP construction.

13. A semiconductor package according to claim 9, wherein said semiconductor element has a system clock frequency of not less than 50 MHz.

14. A semiconductor package according to claim 1, wherein the coating layer covers substantially an entire one of opposite surfaces of an inner lead of said lead frame.

15. A semiconductor package according to claim 9, wherein the coating layer covers substantially an entire one of opposite surfaces of an inner lead of said lead frame.

* * * * *